(12) United States Patent
Prevost et al.

(10) Patent No.: US 9,184,769 B2
(45) Date of Patent: Nov. 10, 2015

(54) DECODING METHOD AND DECODER

(75) Inventors: Raoul Prevost, Saint-Andre de Roquelongue (FR); David Bonacci, Toulouse (FR); Martial Coulon, Toulouse (FR); Jean-Yves Tourneret, Toulouse (FR); Julia Le Maitre, Grepiac (FR); Jean-Pierre Millerioux, Toulouse (FR)

(73) Assignee: CENTRE NATIONAL D'ETUDES SPATIALES (C.N.E.S.) (FR)

( * ) Notice: Subject to any disclaimer, the term of this patent is extended or adjusted under 35 U.S.C. 154(b) by 105 days.

(21) Appl. No.: 13/977,776

(22) PCT Filed: Jan. 3, 2012

(86) PCT No.: PCT/EP2012/050046
§ 371 (c)(1),
(2), (4) Date: Jul. 1, 2013

(87) PCT Pub. No.: WO2012/093115
PCT Pub. Date: Jul. 12, 2012

(65) Prior Publication Data
US 2013/0275841 A1    Oct. 17, 2013

(30) Foreign Application Priority Data
Jan. 3, 2011    (FR) ...................................... 11 50018

(51) Int. Cl.
*H03M 13/00* (2006.01)
*H03M 13/25* (2006.01)
(Continued)

(52) U.S. Cl.
CPC ........ *H03M 13/256* (2013.01); *H03M 13/2933* (2013.01); *H03M 13/3944* (2013.01); *H03M 13/09* (2013.01); *H03M 13/3905* (2013.01); *H03M 13/41* (2013.01)

(58) Field of Classification Search
CPC .......... H03M 13/256; H03M 13/2933; H03M 13/3944; H03M 13/09; H03M 13/3905; H03M 13/41
See application file for complete search history.

(56) References Cited

U.S. PATENT DOCUMENTS

| | | |
|---|---|---|
| 5,436,918 A | 7/1995 | Kato et al. |
| 2003/0028838 A1 | 2/2003 | Chang et al. |

FOREIGN PATENT DOCUMENTS

| | | |
|---|---|---|
| EP | 1928179 A1 | 11/2006 |
| JP | 2007295532 A | 11/2007 |

OTHER PUBLICATIONS

International Search Report for corresponding application PCT/EP2012/050046 filed Jan. 3, 2012; Mail date Mar. 22, 2013.
(Continued)

*Primary Examiner* — Sam Rizk
(74) *Attorney, Agent, or Firm* — Cantor Colburn LLP

(57) ABSTRACT

The method according to the invention relates to the decoding of a sequence of symbols, the sequence of symbols having been generated by: calculating a CRC value for an initial message; combining the initial message and the CRC value so as to produce a transformed message; and, encoding the transformed message. The decoding comprises: generating a number of path hypotheses via a trellis diagram corresponding to the trellis diagram of a finite-state machine comprising the encoder and the CRC generator, in which the encoder and the CRC generator are supplied with the same input. According to a preferred embodiment of the method, the trellis diagram is adapted to take into account bit stuffing possibly inserted in the transformed message before encoding.

14 Claims, 8 Drawing Sheets

(51) Int. Cl.
*H03M 13/29* (2006.01)
*H03M 13/09* (2006.01)
*H03M 13/39* (2006.01)
*H03M 13/41* (2006.01)

(56) References Cited

OTHER PUBLICATIONS

G. Bollati, "A 450Mbit/s Parallel Read/Write Channel with Parity Check and 16-State Time Variant Viterbi", IEEE2000 Custom Intergrated Circuits Conference, May 24, 2000, pp. 319-322; XP002288505.

Bill McDaniel, "An Algorithm for Error Correcting Cyclic Redundance Checks", Jun. 1, 2003, pp. 1-9; Retreived from the Internet: URL: http://drdobbs.com/web-development/184401662?cid+dobbs-callout-mostpop, XP002647114.

Dragan Petrovic, "List Viterbi Decoding with Continuous Error Detection for Magnetic Recording", Globecomm 2001. vol. 5, pp. 3007-3011, XP010747545.

Hideki Sawaguchi, "A Concatenated Coding Technique for Partial Response Channels", IEEE Transactions on Magnetics, vol. 37, No. 2., Mar. 2001, pp. 695-703, XP002285557.

Juan Song, "Design and Implementation of WTB Controller Using SOPC Technology", Signal Processing, 2008. pp. 2804-2807, XP031369651.

International Preliminary Report on Patentability for corresponding application PCT/EP2012/050046 filed Jan. 3, 2012; Mail date Jul. 18, 2013.

Hasegawa et al. "A Decoding Algorithm for q-ary Turbo Codes by Deleting Trellis" IEICE Technical Report, Jul. 14, 2005, vol. 105, No. 190, pp. 9-14, IT2005-37.

Japanese Examination Report issued Oct. 28, 2014 re: Application No. 2013-546734.

Stephan Holsten et al. Global Maritime Surveillance with Satellite-Based Ais. Oceans 2009-Europe, May 14, 2009; pp. 8.

DECODING METHOD AND DECODER

TECHNICAL FIELD

The present invention relates to a method for decoding a sequence of symbols, in particular a symbol sequence that was obtained by encoding a data packet containing a message and a cyclic redundancy check block obtained from the message. The invention further relates to a decoder and a computer programmer for the implementation of the decoding method.

BACKGROUND

FIG. 1 shows a conventional transmission chain. In a first step 12, the message to be transmitted 10 (original message) is used to calculate a cyclic redundancy check (CRC) block. The CRC technique is commonly used for detecting transmission errors by adding redundancy. The redundancy block is attached to the original message (by concatenating the binary sequences of the message and the redundancy block). Hereinafter, the message obtained by adding the redundancy block or by another preliminary transformation is designated <<transformed message>> in order to differentiate it from the original message. In the context of this document, the original message can be an informational message or any other message that can be represented in binary form.

The CRC block is a binary sequence of defined length which is obtained by a hash of the original message. A CRC block of length n calculated on an original message of any given length permits the detection of all error bursts with a length that does not exceed n and a fraction of $1-2^{-n}$ of the error bursts having a greater length. The CRC block is calculated by polynomial modulo 2 division. For this purpose, a polynomial of the message, hereinafter denoted M(x), is associated with the original message. The CRC block corresponds to the remainder R(x) of the polynomial modulo 2 division of $M(x) \cdot x^{n+1}$ by the generator polynomial of degree n+1, denoted G(x). The quotient of the division can be ignored. The degree of the remainder R(x) cannot be greater than the degree of G(x) minus one, i.e. n. Where necessary, 0-valued bits are added to the remainder R(x) to create a CRC block of fixed length. In order to calculate the CRC block, one can use in particular a linear feedback shift register. The data packet formed by the original message, onto which has been attached the CRC block, is sometimes referred to as "code word".

The data packet composed of the original message and the CRC block is then trellis coded in step 14. This trellis coding can consist of a channel coding, for example a convolutional coding, or be implicit in the modulation, for example in the case of a continuous phase modulation.

The symbol sequence obtained by the coding is then used to modulate (in the modulation step 16) a signal for the purposes of the transmission by the transmission channel 18.

At the receiver side, the transmitted signal is demodulated (in the demodulation step 20) in a coherent manner (i.e. by using the known carrier phase) or in a non-coherent manner (i.e. without using the known carrier phase) and decoded (in the decoding step 22) by a decoding trellis algorithm, such as, for example with the help of the Viterbi algorithm, or even the SOVA algorithm (Soft Output Viterbi Algorithm), or even the BCJR algorithm (named after its inventors Bahl, Cocke, Jelinek and Raviv), or even a simplified BCJR algorithm.

In order to detect and/or correct the transmission errors, the receiver verifies the CRC of the message transmitted in step 24 before releasing the verified/corrected message (step 26) or an error message in the case where the correction would not be possible. Different methods are known for verifying the CRC. One of these methods consists in calculating the CRC on the received sequence of information bits and comparing it with the CRC of the transmitted message. A method that can be more easily implemented in hardware uses the property that the CRC of a binary sequence consisting of a message followed by its CRC is zero, and can be expressed as follows:

$$CRC([\text{data}, CRC(\text{data})])=0$$

where CRC(.) designates the result of the calculation of CRC and [.,.] the concatenation of two binary sequences. Hence, with this method the CRC of the transmitted message is calculated (i.e. on the set of the information bits and the redundancy bits obtained from the decoding). If the result is 0 then the message is considered to have been correctly transmitted. Other methods exist that enable the position of an error bit to be detected. A method of this type is described, particularly in the article by B. McDaniel, An algorithm for error correcting cyclic redundancy checks, C/C++ Users Journal, p. 6, 2003. Developments of this method enable several error bits to be corrected (cf. e.g. S. Babaie, A. K. Zadeh, S. H. Es-hagi, N. J. Nvimipour, Double bits error correction using CRC method, International Conference on Semantics, Knowledge and Grid, no 5, pp. 254-257, 2009 and C. Shi-yi and L. Yu-bai, Error correcting cycle redundancy checks based on confidence declaration, ITS Telecommunications Proceedings, no 6, pp. 511-514, 2006).

FIG. 2 shows a conventional transmission chain that differs from that of FIG. 1 in that the stuffing bits or stuffed bits that represent neither information nor redundancy are inserted in the transformed message (step 13). These stuffing bits are typically used to limit the number of consecutive bits of the same value and to introduce supplementary transitions. The supplementary transitions serve in particular to reduce the synchronization problems at the level of the receiver or to avoid the occurrence of binary sequences with a specific meaning (such as control sequences, for example). The HDLC protocol (acronym for High-level Data Link Control) uses stuffing bits to avoid the appearance of the flag for the time frame end (which in the case of HDLC corresponds to the binary sequence 01111110). According to the HDLC protocol, a 0 bit is inserted behind a sequence of five consecutive bits of value 1, thereby ensuring that the flag for the time frame end does not appear in the middle of a message. This is illustrated in FIG. 3. The stuffing bits can have the value 0 and/or 1, depending on the protocol specifications in question. In the case of HDLC or AIS (acronym for Automatic Identification System), the stuffing bits are always bits of value 0. It should also be noted that the concept of inserting stuffing bits must not be confused with the concept of padding that consists in the insertion of bits to arrive at a binary sequence of a predetermined length. To recover the original message, the stuffing bits are removed (step 23) after decoding, but before the CRC check, as the CRC block ignores stuffing bits possibly contained in the transformed message. In addition, the CRC block can itself contain stuffing bits that can prevent checking.

All known methods of CRC verification or correction of the message based on the CRC block assume that the stuffing bits were removed from the received message before they could be applied, which in practical terms greatly reduces their interest.

BRIEF SUMMARY to the disclosure proposes a decoding method that enables the correction of erroneous bits based on the CRC, where appropriate even in the presence of stuffing bits.

The method according to the invention is applied to decoding a sequence of symbols, said sequence having been generated by calculating a cyclic redundancy check block for an original message, combining the original message and the cyclic redundancy check block to produce a transformed message and encoding the transformed message. The decoding involves the generation of a plurality of path hypotheses across a trellis comprising nodes and branches, representing the possible transitions between the nodes, as well as the selection of the most probable path hypothesis from said path hypotheses, with respect to the sequence of symbols. In the context of the invention, the nodes of the trellis represent the elements of a Cartesian product of at least the set of encoder states likely to have performed the encoding and the set of calculator states likely to have calculated the CRC block. A transition from a first node, corresponding to a first encoder state and a first calculator state, to a second node, corresponding to a second encoder state and a second calculator state, is possible.

in the presence of a bit of transformed message, if
on applying this bit of transformed message to the encoder that is in the first encoder state, the encoder then passes to the second encoder state, and
on applying this bit of transformed message to the calculator that is in the first calculator state, the calculator passes to the second calculator state.

Therefore it is proposed to use an 'extended' trellis, whose nodes not only represent the different encoder states but also the states of the CRC block calculator. In other words, the 'extended' trellis corresponds to a finite state machine that comprises the encoder and the CRC calculator, and in which the encoder and the CRC calculator are fed by the same input, i.e. change states as a function of the same binary sequence that is fed in.

In the method according to the invention, and when the Viterbi algorithm or even the SOVA algorithm is used, then the path hypothesis that is retained is that which represents the most probable sequence of encoder and CRC calculator states. The most probable path hypothesis is normally that which exhibits the shortest distance (e.g. Hamming or Euclidian) with respect to the symbol sequence. In the case where the BCJR algorithm is used, or even the simplified BCJR algorithm, then the most probable received bits among the probabilities calculated by the BCJR or simplified BCJR algorithm are accepted as the hypothesis.

The method according to the invention can be adapted in the case where stuffing bits had been inserted, before coding, into the data packet (the transformed message) containing the original message and the CRC block. In this case, certain branches of the trellis represent conditional transitions that may be made only when bit stuffing is present. A transition from a first node (corresponding to a first encoder state and a first CRC calculator state) to a second node (corresponding to a second encoder state and a second CRC calculator state) of the trellis is moreover possible (case of a conditional transition):

in the presence of a stuffing bit, if
on applying this stuffing bit to the encoder that is in the first encoder state, the encoder then passes to the second encoder state, and
the first calculator state is equal to the second calculator state.

This transition takes account of the fact that a stuffing bit will have caused, in encoding, a change in the encoder state (identical to the change in state that the encoder would have undergone in the presence of an information bit or CRC of the same value as the stuffing bit), whereas the stuffing bits have no impact on the CRC calculator state.

Preferably, when the method is executed and a path hypothesis is being constructed, a stuffing bit is considered detected if the conditions according to which the insertion of a stuffing bit is performed are met. If, for example, a stuffing bit had been inserted immediately after each sequence of five consecutive bits having the value 1 before the transmission of the message, then in each path hypothesis a bit that immediately follows a sequence of five consecutive bits having the value 1 is considered to represent a stuffing bit.

A state variable is preferably associated with each path hypothesis and as the path hypothesis is being constructed, is updated as a function of the already constructed part of the path hypothesis. The state variable is then monitored so as to determine whether the conditions in which a stuffing bit is inserted are met. For example, this state variable can indicate the number of consecutive bits of the same value for each path hypothesis. In the example where a stuffing bit is inserted behind a bit on condition that this bit is preceded by a sequence of five bits having the value 1, then as a path hypothesis progresses across the trellis a variable is monitored that indicates the number of bits of value 1 which have immediately preceded the existing bit. As soon as this variable reaches the value 5, then the next bit has to be a stuffing bit and the corresponding conditional transition is chosen.

The original message may possibly contain one or a plurality of redundancy bits (e.g. a CRC block that is not used during the decoding per se), based on which one can check if the message obtained as a result of the selected path hypothesis does not contain errors. If the original message contains a CRC block then this must not have been calculated by the same polynomial generator as that which is added in order to give the transformed message. If not, the latter will always be equal to 0 as a result of the application of CRC([data, CRC (data)])=0.

It can be appreciated that the method according to the invention may be used for correcting AIS messages. The sequence of symbols is then obtained from an AIS signal, for example received by a satellite, in particular a low earth orbit satellite. The AIS signal is possibly received at the same time as other AIS signals (i.e. received simultaneously or with a time overlap). In this case the method according to the invention is advantageously combined with "decollision" and demodulation methods for the AIS signals, for example the SIC method (Successive Interference Cancellation) or the deterministic or adaptive beam formation. A method for generating a plurality of candidate AIS messages from colliding AIS signals is described in the document US 2008/0304597. These candidates could be used as symbol sequences in the method according to the invention. Note that this method can be used at the level of a receiver on board a satellite or on the ground.

An aspect of the invention relates to a computer programmer containing instructions causing the implementation of the above-described method when the computer programmer is executed by a computer. The computer programmer can make up a part of a computer programmer product that comprises a data storage medium (e.g. a hard disc, a flash memory, a USB key, a CD, a DVD, RAM, etc.) on which the programmer is stored.

Another aspect of the invention relates to decoder configured e.g. with an appropriate computer programmer in order to implement the method of the invention.

BRIEF DESCRIPTION OF THE DRAWINGS

Other characteristics and features of the invention will become apparent from the detailed description of some advantageous exemplary embodiments given below, for illustration, with reference to the accompanying drawings. They show.

DESCRIPTION OF A PREFERRED IMPLEMENTATION

Figure 1:
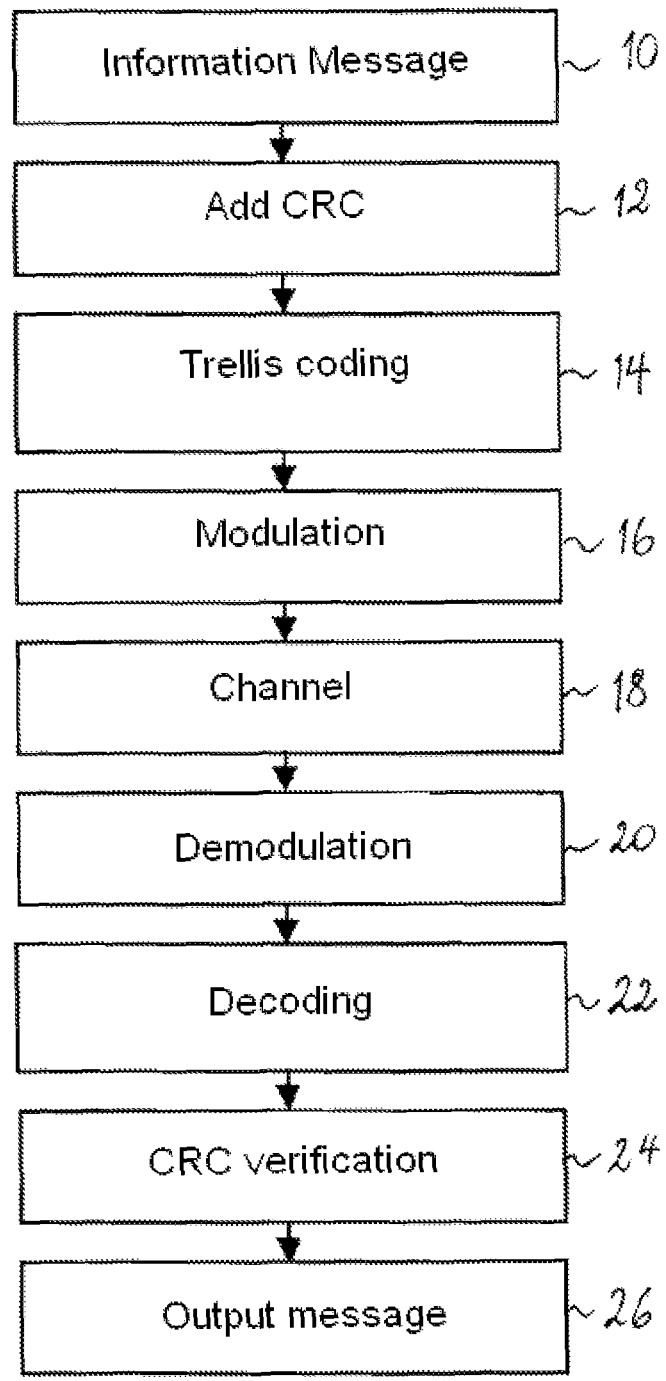
FIG. 1: an outline schematic of a conventional transmission chain of messages.
Figure 2:
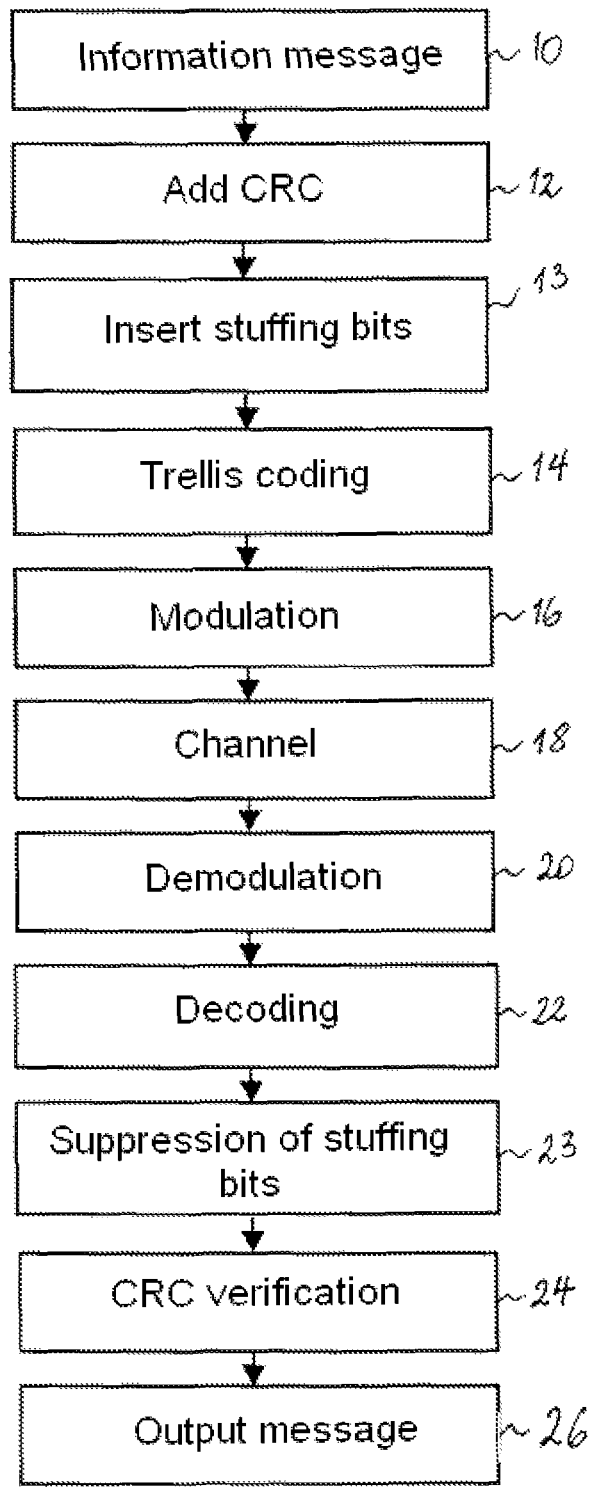
FIG. 2: an outline schematic of a conventional transmission chain of messages with insertion/suppression of stuffing bits.
Figure 3:
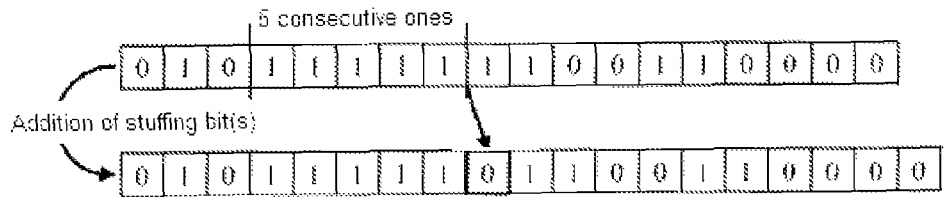
FIG. 3: an illustration of the insertion of stuffing bits.
Figure 4:
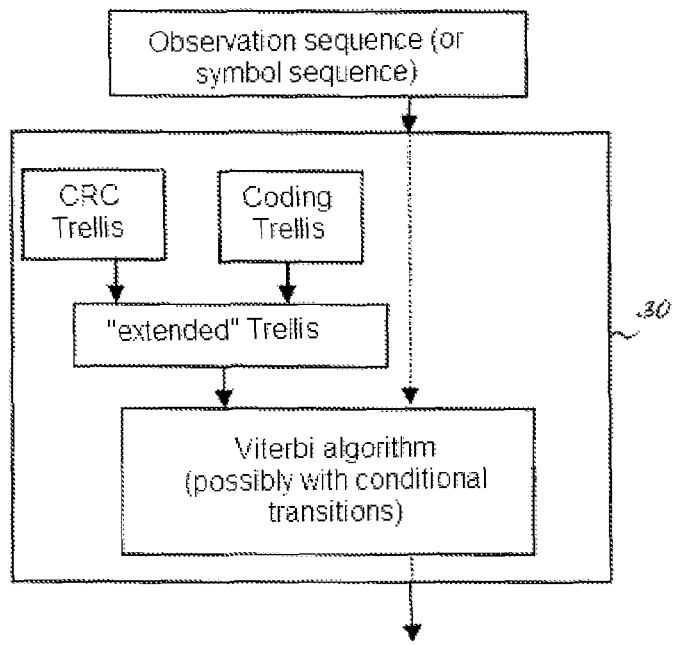
FIG. 4: a simplified schematic of a decoder to implement the method according to the invention.

FIG. 4 shows a simplified schematic of a decoder 30 to implement the method according to the invention; This decoder 30 is intended to replace the decoding stage 22 and the CRC verification stage 24 in the conventional transmission chain shown in FIG. 1 (variant without suppression of stuffing bits) or the decoding stage 22, the suppression stage for stuffing bits 23 and the CRC verification stage 24 (variant with suppression of the stuffing bits).

Variant Without Suppression of Stuffing Bits

We shall first discuss the variant without suppression of stuffing bits (applicable only if the insertion of the stuffing bits is not foreseen in the transmission protocol).

As mentioned above, the method uses an 'extended' trellis, whose nodes not only represent the different encoder states but also the calculator states of the CRC block. It is well known to use, e.g. in the context of the Viterbi algorithm, a trellis representing the states and transitions of the encoder. In contrast, the inventor is unaware that a trellis associated with the CRC calculator (briefly "CRC trellis") has ever been used in the context of decoding a sequence of symbols and for correcting associated transmission errors. Consequently, an explanation should be made on the meaning of "CRC trellis").

A CRC block can be calculated iteratively by means of a linear feedback shift register associated with the polynomial generator. The register is initialized (normally with the sequence [00 . . . 0] or [11 . . . 1], although any other initial register state could be specified by protocol). The original message is applied bit by bit to the register, followed by as many zeros as the register contains cells. The thus obtained final state corresponds to the CRC block that is attached to the original message. The CRC calculator intermediate states (the linear feedback shift register associated with the CRC polynomial generator) can be imagined to represent the states (nodes) of the CRC trellis. These states are interconnected by transitions (branches) that link a first CRC calculator state to a second calculator state that is attained by inputting a new bit to the calculator when it is in the first state.

Figure 5:
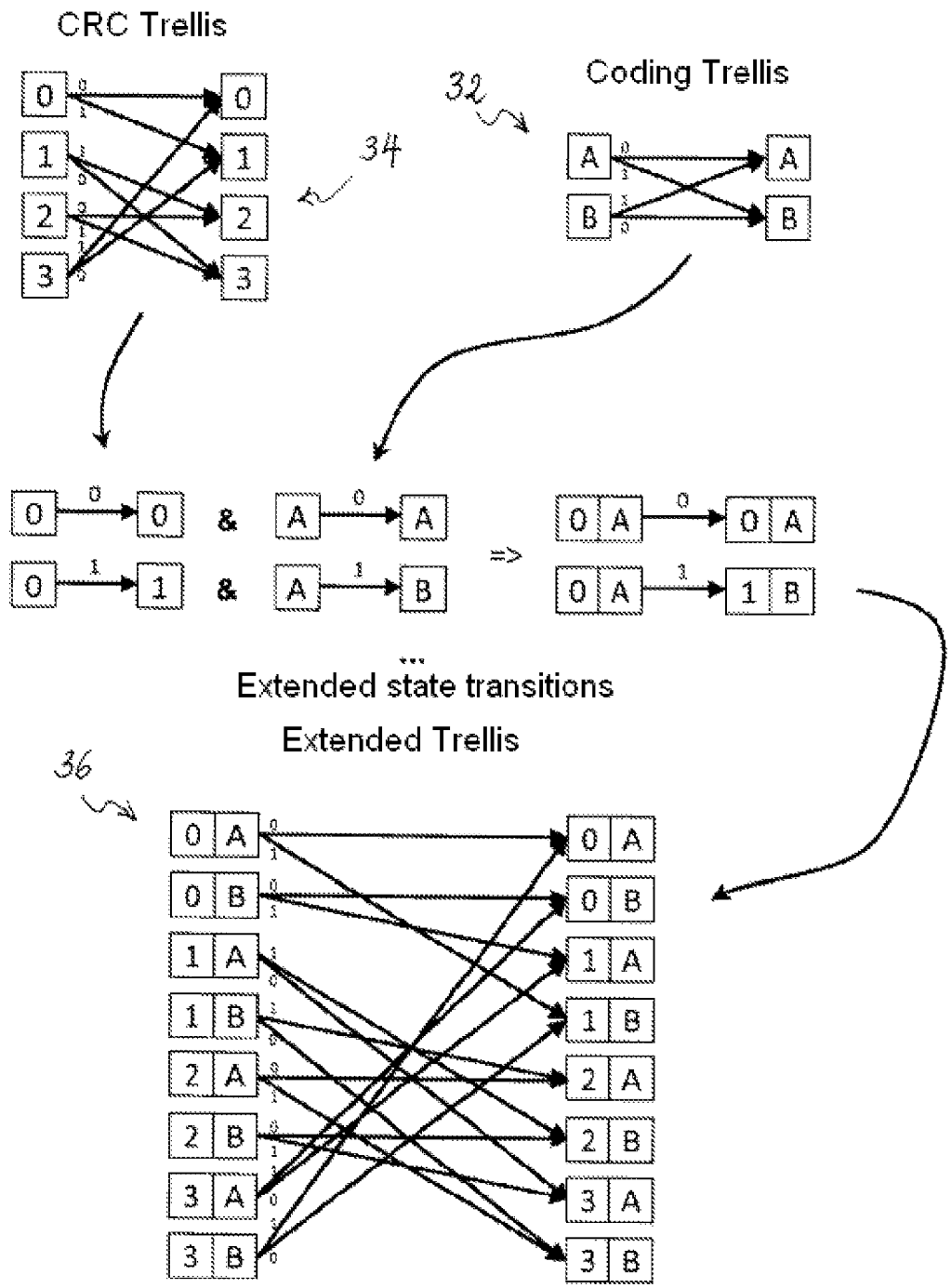
FIG. 5: an illustration of the construction of the extended trellis.

FIG. 5 is an illustration of the construction of an extended trellis 36 from a coding trellis 32 and a CRC trellis 34. The CRC trellis 34 corresponds to a case where the CRC calculator can be in four different states, numbered 0, 1, 2 and 3. The arrows leaving each state correspond to the branches of the CRC trellis and indicate the following state of the CRC calculator according to whether the applied input bit is zero or one. The coding trellis 32 has two states.

The 'extended' trellis corresponds to the trellis of a finite state machine that comprises the encoder and the CRC calculator, and in which the encoder and the CRC calculator are fed by the same input, i.e. change states according to the same binary sequence that is input. The set of the extended trellis nodes therefore corresponds to the Cartesian product $\{(0;A), (0;B), (1;A), \ldots, (3;B)\}$ of the set of the nodes of the CRC trellis $\{0, 1, 2, 3\}$ and of the set of the nodes of the coding trellis $\{A, B\}$. A transition between a first node $(\alpha; X)$, corresponding to a first calculator state $\alpha \in \{0, 1, 2, 3\}$ and a first encoding state $X \in \{A, B\}$, to a second node $(\beta; Y)$, corresponding to a second calculator state $\beta \in \{0, 1, 2, 3\}$ and a second encoding state $Y \in \{A, B\}$ is possible if the transitions $\alpha \rightarrow \beta$ and $X \rightarrow Y$ of the CRC trellis, respectively the coding trellis, are generated by the same input bit (0 or 1). For example, if the state Y (respectively Z) of the coding trellis leads to the state X when the transmitted bit is 0 (respectively 1) and the state $\beta$ (respectively $\gamma$) of the CRC trellis leads to the state $\alpha$ when the transmitted bit is 0 (respectively 1), then the state $(\beta; Y)$ (respectively $(\gamma; Z)$) leads to the state $(\alpha; X)$ when the transmitted bit is 0 (respectively 1). In FIG. 5, the bit that generates a transition is placed each time next to the arrow that represents it.

The number of extended trellis states amounts to the product of the number of nodes of the coding trellis and of the CRC trellis. The CRC trellis in particular can exhibit a very high number of nodes. There exist e.g. CRC blocks with 64 bits, corresponding to a CRC trellis with $2^{64}$ possible states.

Figure 6:
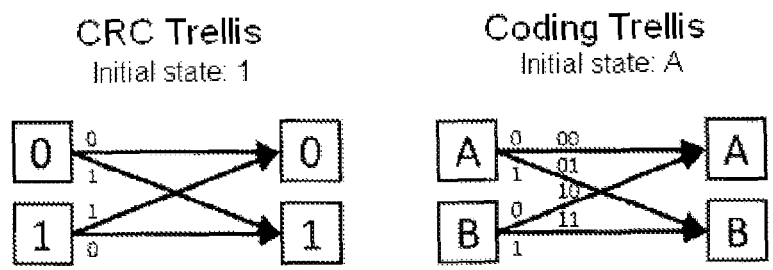
FIG. 6: a CRC trellis and a coding trellis.
Figure 7:
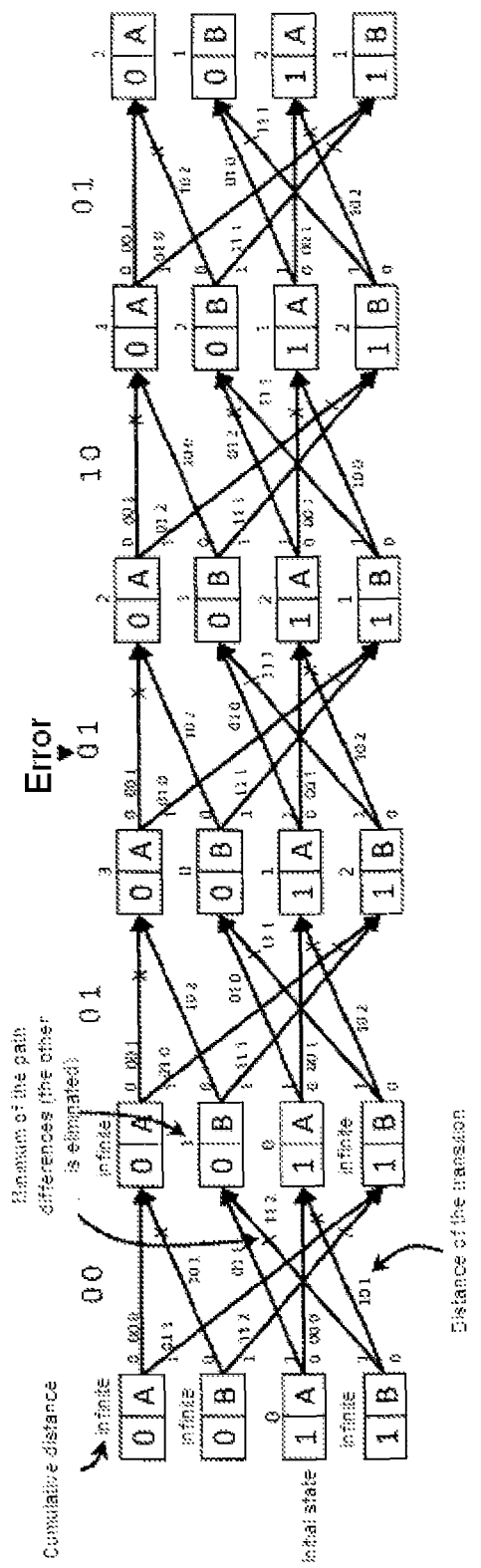
FIG. 7: an illustration of the construction of path hypotheses across the extended trellis associated with the CRC and coding trellises of FIG. 6.

To explain the progress of an embodiment of the inventive method based on the Viterbi algorithm, the shortest possible CRC (1 bit) was chosen so as to be able to graphically illustrate the construction of the path hypotheses across the trellis (see FIG. 7). The CRC and coding trellises selected in the example are shown in FIG. 6.

Let us assume that the original message is represented by the binary sequence [0 1 1 0]. The CRC block calculated for this original message is [1]. This CRC block corresponds to the parity bit that indicates if the number of ones in the original message is even. The data packet (transformed message) obtained by concatenation of the original message and the CRC block is [0 1 1 0 1].

By applying the coding trellis of FIG. 6, the coding of [0 1 1 0 1] gives the symbol sequence [00 01 11 10 01]. An error of one bit is added at the level of the third symbol to illustrate that the correction is made. The symbol sequence at the input of the decoder is presumed to be [00 01 01 10 01].

FIG. 7 shows the construction of the path hypotheses across the extended trellis according to the Viterbi algorithm. The initial states of the CRC calculator and the encoder are known when decoding. Therefore, right at the beginning, the path hypotheses that do not begin at the state (1; A) can be excluded. Alternatively, an infinite distance is attributed to the path hypotheses that start with a state that differs from the initial state (solution used in the depiction in FIG. 7). This way ensures that these path hypotheses will be eliminated in the course of the progression across the trellis. FIG. 7 shows beside each transition the symbol to which this transition corresponds. The indication of the symbol is followed by the distance (Hamming) between the observed symbol and the symbol to which the transition corresponds. Each time that the path hypotheses arrive at the same node of the trellis, only that which exhibits the lowest cumulative distance survives. The other path hypotheses are eliminated. In FIG. 7 the eliminated path hypotheses are marked with a cross and the cumulative distance of the surviving path hypothesis is noted above the node in question. In the following, the cumulative distance is designated $\Gamma(k, (\alpha; X))$ at the state $(\alpha; X)$ at the instant k.

When the final state is reached, the path hypothesis with the minimum distance is selected. It should be noted that in the case of the example, the path hypotheses that arrive at the nodes (0; B) and (1; B) possess the same minimum distance 1. Here, the property CRC([data, CRC(data)])=0 is used, since it follows from this that the final state of the CRC calculator must be 0. Consequently, the path hypothesis leading to the state (0; B) is retained. The message that is found is therefore [0 1 1 0 1]. The transmission error has been corrected.

Variant Without Suppression of Stuffing Bits

The procedure for the example discussed above may not be applied as such in the case where stuffing bits had been inserted after the calculation of the CRC block.

In order to take account of the (possible) presence of stuffing bits, special transitions are entered into the extended trellis. These transitions are followed when a stuffing bit is received and are defined in such a way that the stuffing bits are taken into account in the same way as the information bits or the CRC bits for the succession of the encoder states, whereas the CRC calculator state remains unchanged when the received bit is a stuffing bit.

Hereinafter, we will assume that the stuffing bits are inserted as defined in the HDLC protocol, i.e. that one stuffing bit of value 0 is inserted immediately after each sequence of five consecutive bits of value 1. Note that this choice has been made solely to be able to illustrate the invention in the context of a practical example. The person skilled in the art will have no difficulty in adapting the method of the invention to other scenarios that involve the insertion of stuffing bits.

Figure 8:
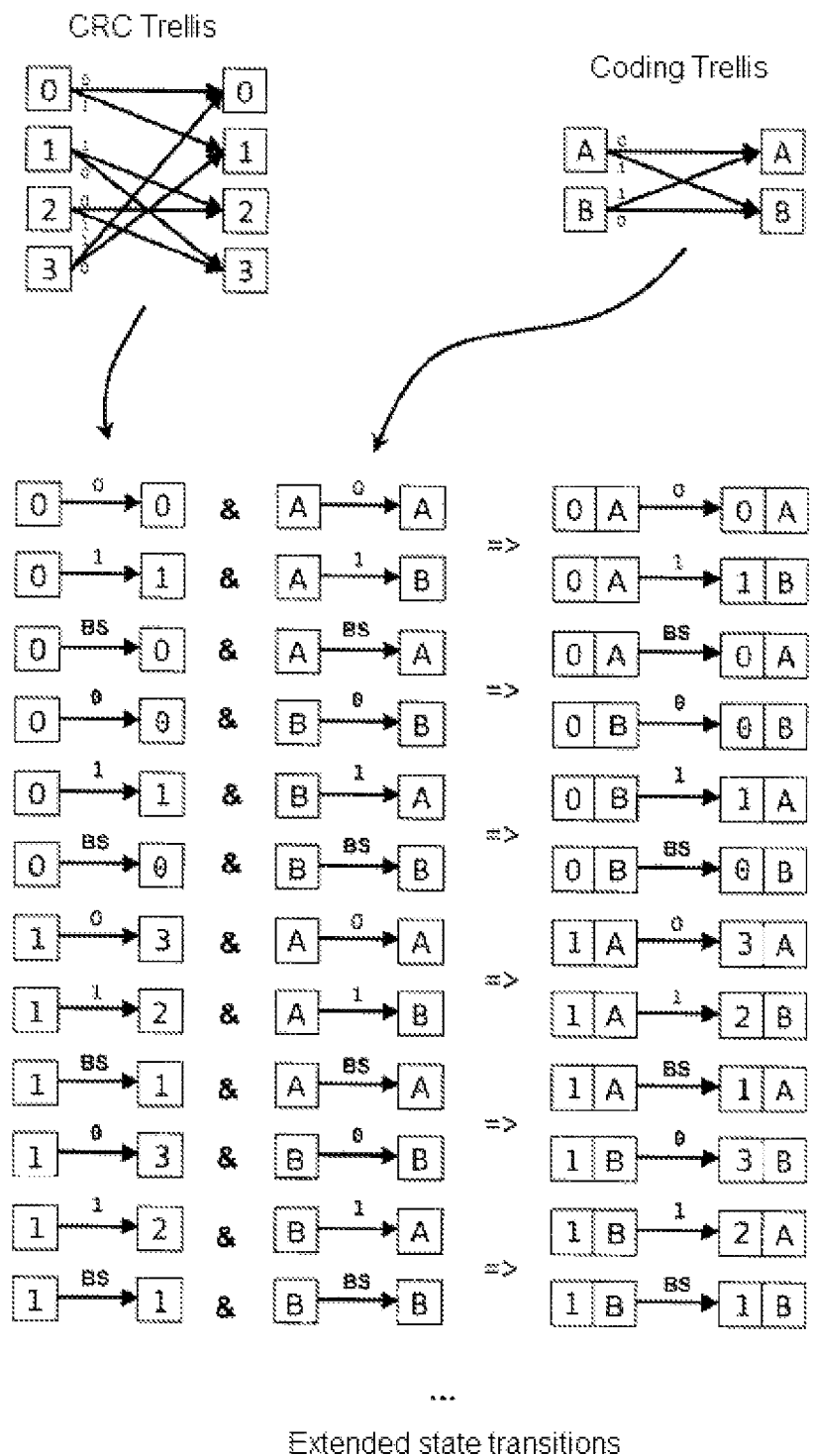
FIG. 8: an illustration of the construction of an extended trellis with transitions associated with the reception of a stuffing bit (conditional transitions)

The construction of a trellis extended to conditional transitions of stuffing bits starting from a CRC trellis and a coding trellis is illustrated in FIG. 8. The CRC and coding trellises are the same as in FIG. 5. The set of the extended trellis nodes again corresponds to the Cartesian product $\{(0; A), (0; B), (1; A), \ldots, (3; B)\}$ of the set of the nodes of the CRC trellis $\{0, 1, 2, 3\}$ and of the set of the nodes of the coding trellis $\{A, B\}$. The transitions associated with the information bits or the CRC bits (of the data packet) can now be distinguished from the conditional transitions associated with the stuffing bits. The transitions associated with the information bits or the CRC bits are the same as in FIG. 5. A transition associated with an information bit or CRC bit of a first node $(\alpha; X)$, corresponding to a first calculator state $\alpha \in \{0, 1, 2, 3\}$ and a first encoding state $X \in \{A, B\}$, to a second node $(\beta; Y)$, corresponding to a second calculator state $\beta \in \{0, 1, 2, 3\}$ and a second encoding state $Y \in \{A, B\}$ is possible if the transitions $\alpha \to \beta$ et $X \to Y$ of the CRC trellis, respectively the coding trellis, are generated by the same information bit or CRC bit (0 or 1) applied at the input. A transition associated with a stuffing bit BS of a first node $(\alpha; X)$, corresponding to a first calculator state $\alpha \in \{0, 1, 2, 3\}$ and a first encoding state $X \in \{A, B\}$, to a second node $(\beta; 1)$, corresponding to a second calculator state $\beta \in \{0, 1, 2, 3\}$ and a second encoding state $Y \in \{A, B\}$ is possible if $\alpha = \beta$ and if the transition $X \to Y$ of the coding trellis is possible for an information bit or CRC bit having the same value as the stuffing bit BS. If the stuffing bits are inserted as specified in the HDLC protocol, then all the stuffing bits will have the value 0.

If the state Y (respectively Z) of the coding trellis leads to the state X when the transmitted bit is an information bit or CRC bit of value 0 (respectively 1) and the state $\beta$ (respectively $\gamma$) of the CRC trellis leads to the state $\alpha$ when the transmitted bit is an information bit or CRC bit of value 0 (respectively 1), then the state $(\beta; Y)$ (respectively $(\gamma; Z)$) leads to the state $(\alpha; X)$ when the transmitted bit is an information bit or CRC bit of value 0 (respectively 1). This can be written:

$$\alpha \xrightarrow{0} \beta \text{ and } X \xrightarrow{0} Y \implies (\alpha; X) \xrightarrow{0} (\beta; Y)$$

$$\alpha \xrightarrow{1} \gamma \text{ and } X \xrightarrow{1} Z \implies (\alpha; X) \xrightarrow{1} (\gamma; Z)$$

In the presence of a stuffing bit BS (of value 0) then the transitions in this case are:

$$\alpha \xrightarrow{BS} \alpha \text{ and } X \xrightarrow{BS} Y \implies (\alpha; X) \xrightarrow{BS} (\alpha; Y).$$

The conditional transitions are made in the trellis only if a stuffing bit is received. In order to monitor for the appearance of stuffing bits in the course of constructing a path hypothesis, a state variable $P(k, (\alpha; X))$ associated with each state $(\alpha; X)$ is introduced (in the example, $\alpha = 0, 1, 2$ or 3 and $X = A$ or B) at "the instant" k. k indicates the number of states (of nodes) travelled in the trellis before arriving at the state considered via the surviving path hypothesis. $P(k, (\alpha; X))$ indicates the number of consecutive bits of value 1 received immediately before reaching the state $(\alpha; X)$ at the instant k. Another state variable $S(k, (\alpha; X))$ is introduced that indicates the total number of stuffing bits that were met in the trellis before reaching the state $(\alpha; X)$ at the instant k via the surviving path hypothesis. The number S of the ultimately retained path hypothesis permits the number of received information bits and CRC bits to be deduced.

| k | Received bit | k + 1 |
|---|---|---|
| $(\alpha; X)$<br>$P_k < 5, S_k$ | $\xrightarrow{0}$ | $(\beta; Y)$<br>$P_{k+1} = 0, S_{k+1} = S_k$ |
| $(\alpha; X)$<br>$P_k < 5, S_k$ | $\xrightarrow{1}$ | $(\gamma; Z)$<br>$P_{k+1} = P_k + 1, S_{k+1} = S_k$ |
| $(\alpha; X)$<br>$P_k < 5, S_k$ | $\xrightarrow{BS}$<br>impossible! | $(\alpha; Y)$ |
| $(\alpha; X)$<br>$P_k = 5, S_k$ | $\xrightarrow{0}$<br>impossible! | $(\beta; Y)$ |
| $(\alpha; X)$<br>$P_k = 5, S_k$ | $\xrightarrow{1}$<br>impossible! | $(\gamma; Z)$ |
| $(\alpha; X)$<br>$P_k = 5, S_k$ | $\xrightarrow{BS}$ | $(\alpha; Y)$<br>$P_{k+1} = 0, S_{k+1} = S_k + 1$ |

The above table shows the development of the variables P et S in all possible situations. If the received bit is an information bit or a CRC bit with a value 0 then the variable P is reset to zero for the attained state; S remains the same. If the received bit is an information bit or a CRC bit with a value 1 then the variable P is increased by one unit for the attained state and S again remains the same. If the received bit is a stuffing bit (P=5) then P is reset to zero for the attained state, whereas S is increased by one unit.

In the course of construction of a path hypothesis across the extended trellis, the variable P indicates whether the next bit is an information bit (or CRC bit) or a stuffing bit. In our example, the necessary and sufficient condition for a bit to be detected as a stuffing bit is that the bit be immediately preceded with an uninterrupted sequence of five information bits or CRC bits having a value 1. If the variable P reaches 5 in a node of a path hypothesis, then the next transition must be a transition associated with a stuffing bit. Transitions associated with an information bit or a CRC bit are then impossible. If, on the other hand, P<5 in a node of a path hypothesis, then the next transition must be a transition associated with an information bit or a CRC bit. A transition associated with a stuffing bit is impossible starting from this state. In practice, the impossibility of a transition can be expressed by conferring an "infinite" distance to it. A path hypothesis that is extended by a transition of infinite distance in the Viterbi algorithm will not be able to survive and will be eliminated.

To choose the most probable path hypothesis, the characteristic that the final CRC calculator state is equal to 0 can again be used. However, the final encoder state $\theta_{TC}^f$ and the number of bits (information, CRC and stuffing bits) K of the transmitted message are a priori unknown. $\hat{K}$ and $\hat{\theta}_{TC}^f$ represent the values of K, respectively $\theta_{TC}^f$, among the possible values of K and $\theta_{TC}^f$, which together minimize the distance $\Gamma(K, (0; \theta_{TC}^f))$:

$$(\hat{K}, \hat{\theta}_{TC}^f) = \underset{K, \theta_{TC}^f}{\arg\min} \Gamma(K, (0; \theta_{TC}^f))$$

with the constraint:

$$S_{min} \leq S(K, (0; \theta_{TC}^f)) \leq S_{max} \text{ and } N_{min} \leq K - S(K, (0; \theta_{TC}^f)) \leq N_{max},$$

where $S_{min}$ and $S_{max}$ designate respectively the minimum number and the maximum number of stuffing bits, and $N_{min}$ et $N_{max}$ designate respectively the minimum number and the maximum number of information bits and CRC bits. These numbers are defined in the context of the application. For example, for AIS, $S_{min}=0$ and $S_{max}=4$ and $N_{min}=N_{max}=184$. $\hat{K}$ can assume any value between the minimum number of bits $K_{min}=N_{min}+S_{min}$ and the maximum number of bits $K_{max}=N_{max}+S_{max}$.

Example of a Computer Programmer

A source code for a computer programmer used to implement the method according to the preceding example is briefly presented below. The computer programmer excerpts that are referred to are to be found in the appendix at the end of the description.

The first excerpt of the programmer relates to the initialization of the variables. In the context of the programmer, the initial state of the extended trellis is designated by (A; α). A(=the initial state of the CRC calculator) is initialized according to the communication protocol. In the case of AIS, which uses CRC-16, A is initialized to $2^{16}-1$. The distance $\Gamma(0, (A; \alpha))$ is set to zero for all possible values of α(=initial encoder state) if α is unknown. If α is known then $\Gamma(0, (A; \alpha))=0$. The state variable $R(k, (\theta_{CRC}; \theta_{TC}))$ corresponds to the bit (0, 1, or BS) associated with the last transition at the instant k of the surviving path hypothesis at the node $(\theta_{CRC}; \theta_{TC})$.

In the second excerpt of the programmer, the transition variables are updated for each received symbol.

$x_k$ designates the symbol received at the instant k, $N_S$ the number of possible symbols, $S_s$ the s-th symbol (of the possible symbols $N_S$), Distance($x_k$, $S_s$) is the distance between the symbol received at the instant k and the symbol $S_s$. $\theta_{CRC}$ and $\theta_{TC}$ are the states of the CRC block calculator and the encoder respectively. $N_{CRC}$ represents the number of possible states of the CRC trellis and $N_{TC}$ the number of possible states of the coding trellis. Next $S(\theta_{TC}, t)$ refers to the number(s) of the symbol when the encoder is found in the state $\theta_{TC}$ and a bit t is received (t can assume the values 0, 1, or BS). The transition variable $\Gamma_{trans}((\theta_{CRC}; \theta_{TC}), t)$ is defined at the instant k as the sum of $\Gamma(k-1, (\theta_{CRC}; \theta_{TC}))$ and the distance between the symbol received at the instant k and the symbol corresponding to the transition that starts from the state $(\theta_{CRC}; \theta_{TC})$ and that is associated with the bit t. The transition variable $S_{trans}(\theta_{CRC}; \theta_{TC})$ is defined at the instant k as $S(k-1, (\theta_{CRC}; \theta_{TC}))$ incremented by one if a stuffing bit is received after the state $(\theta_{CRC}; \theta_{TC})$ at the instant k. The transition variable $P_{trans}((\theta_{CRC}; \theta_{TC}), t)$ is defined at the instant k as $P(k-1, (\theta_{CRC}; \theta_{TC}))$ incremented by one when the state $(\theta_{CRC}; \theta_{TC})$ is followed by a bit of one (t=1) at the instant k. In the case where the received bit is not a stuffing bit (t≠BS), the transition variables are updated as in the conventional Viterbi algorithm. In the opposite case, only the conditional transitions remain possible (an infinite distance is attributed to the transitions associated with an information bit or CRC bit).

The third part of the programmer deals with the calculation of the state variables. The function $\text{Prev}\theta_{CRC}(\theta_{CRC}, t)$ refers to the CRC calculator state that precedes the state $\theta_{CRC}$ if the bit t is received. The function $\text{Prev}\theta_{TC}(\theta_{TC}, t)$ refers to the encoder state, to which follows the state $\theta_{TC}$ if the bit t is received.

In the fourth excerpt, the optimum path hypothesis is retraced across the extended trellis. Starting from the estimated final state $(0; \hat{\theta}_{TC}^f)$, the preceding states are determined iteratively by following each time in the reverse direction the transition branch that survived the currently located state. Each time a transition is followed that corresponds to an information bit or a CRC bit (t=0 or 1), the corresponding bit is saved in the variable $U_n$. The sequence $(U_n)$ represents the decoded message from which the stuffing bits have been eliminated.

Results of Simulations

Figure 9:
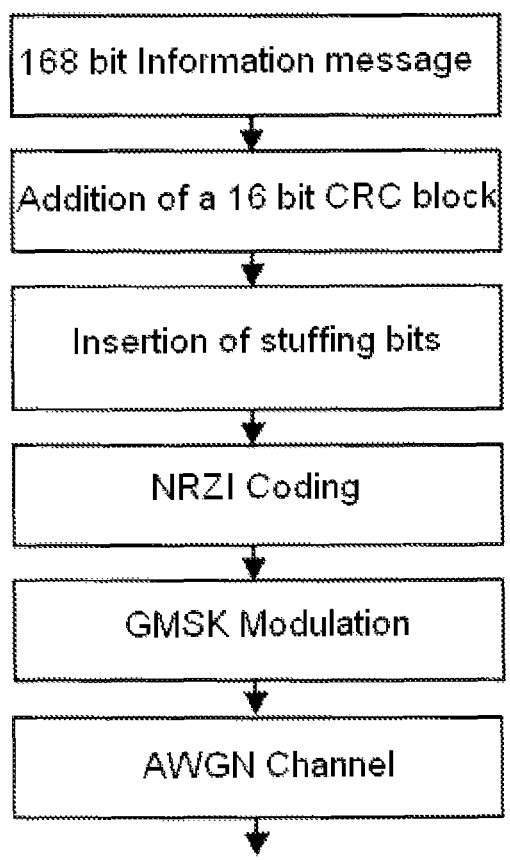
FIG. 9: an outline schematic of the receiving side of an AIS transmission chain.

In order to illustrate the performance of a decoder that implements the method according to the invention, simulations were carried out for the case of an AIS transmission chain, such as the one illustrated in FIG. 9. The original message had a fixed length of 168 bits. After having added a CRC 16 block, stuffing bits were inserted (in accordance with the AIS protocol after a sequence of five consecutive 1 bits). The thus obtained frame was NRZI (Non Return to Zero Inverted) encoded and GMSK (Gaussian Minimum Shift Keying) modulated with the parameters BT (product of the frequency band at −3 dB from the generating function of the Gaussian filter by the period symbol)=0.3 and LT (half-length of the Gaussian filter)=4. We assume the hypothesis of an AWGN (Additive White Gaussian Noise) transmission channel. In this example the NRZI coding and the GMSK modulation represent the trellis coding. According to the ITU recommendation ITU-R M.1371 on the technical characteristics of the AIS system, the polynomial generator for calculating the CRC block is $G(x)=x^{16}+x^{12}+x^5+1$.

The decoder according to the invention is compared with a receiver based on an optimal GMSK modulator that uses the coherent demodulation based on the Viterbi algorithm. In the NRZI decoding under consideration, a change is associated with the 0 bit and the 1 bit is detected if there is no change.

Figure 10:
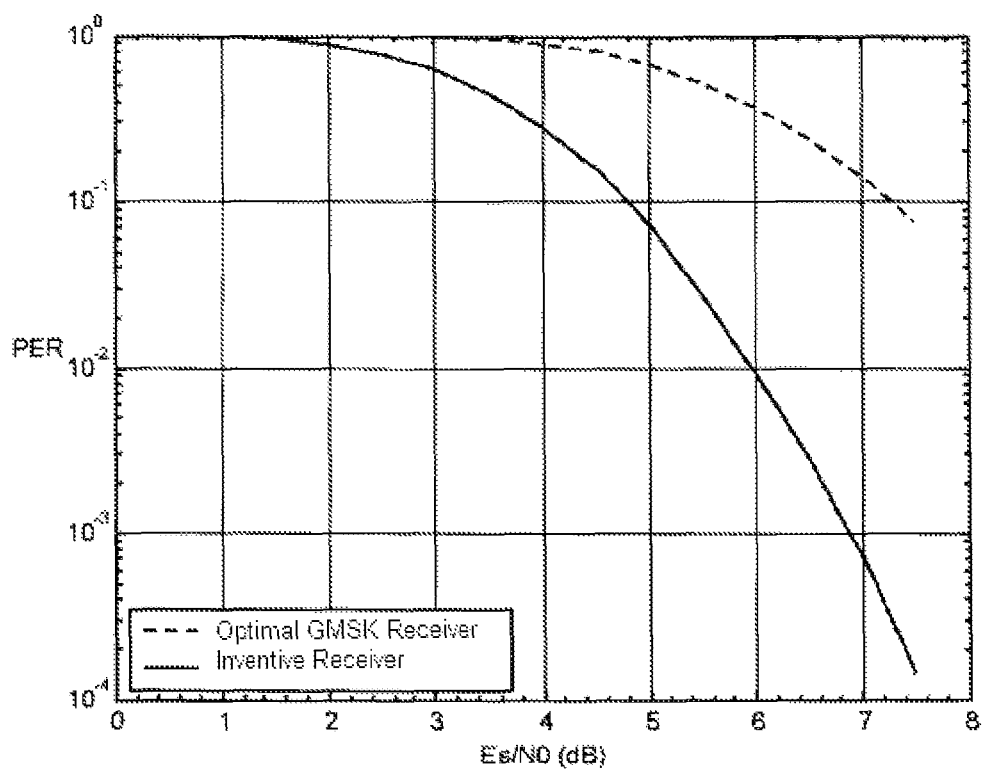
FIG. 10: a graphical representation of the simulated packet error rate (PER) as a function of the signal to noise ratio for an optimal GMSK receiver and for a receiver using the method according to the invention.

FIG. 10 shows the packet error rate (PER, defined as the ratio of the corrupted packets, i.e. containing at least one error bit, to the total number of transmitted packets) of a receiver using a decoder according to the invention and an optimal GMSK receiver as a function of the signal to noise ratio (Es/N0). It should be noted that the proposed receiver exhibits a gain of more than 2.5 dB with respect to the optimal GMSK receiver.

Figure 11:
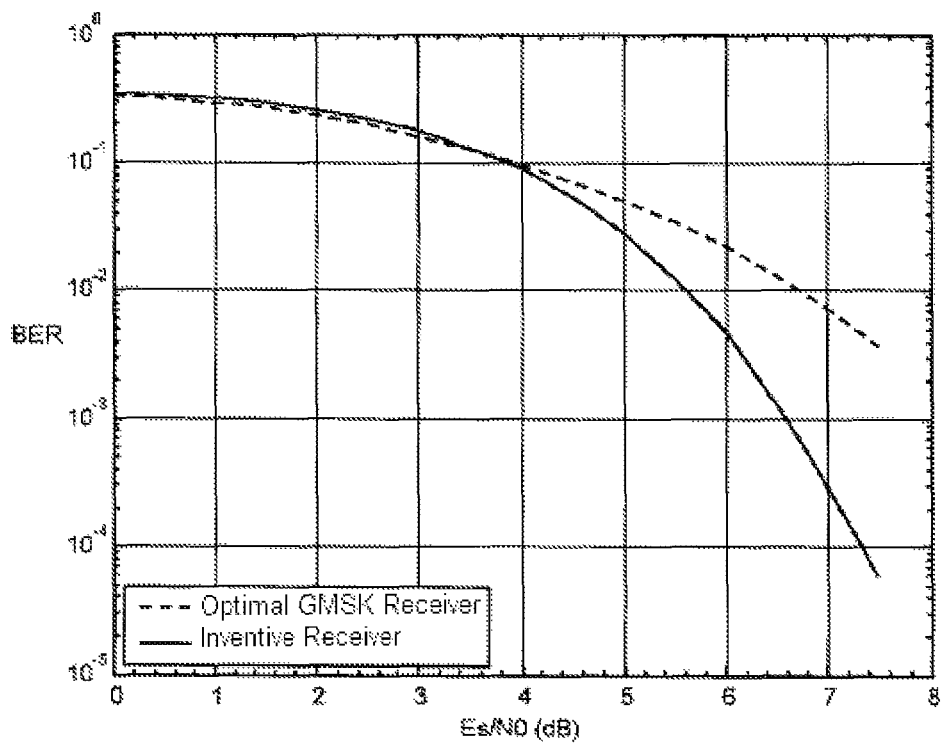
FIG. 11: a graphical representation of the simulated bit error rate (BER) as a function of the signal to noise ratio for an optimal GMSK receiver and for a receiver using the method according to the invention.

FIG. 11 shows the bit error rate (BER, defined as the ratio of the error bits to the total number of bits transmitted during a certain period of time) of a receiver using a decoder according to the invention and an optimal GMSK receiver as a function of the signal to noise ratio (Es/N0). The high error rate of FIG. 11 indicates that the error rate in the corrupted messages is high. In other words, when a message contains at least one error, on average it contains many. This enables verification methods for data consistency to be used to determine if a message contains errors. The use of such methods has proven to be useful for the detection of corrupted messages because the CRC block cannot be used to reject a decoded message as a corrupted one. However, a CRC block could be included from the outset in the original message; this block would not be used for error correction but for verifying that the message is error-free after the method according to the invention had been run. However, this CRC may not use the same polynomial generator as that of the CRC used to correct the errors. Otherwise, the second CRC will always be equal to 0 as a result of the application of CRC([data, CRC (data)])=0.

Excerpts from the Computer Program

```
Part 1 (initialization)
    Γ(0, (:; :)) ← ∞
    Γ(0, (A; α)) ← 0
    P(0, (:; :)) ← 0
    S(0, (:; :)) ← 0
    R(0, (:; :)) ← 0
Part 2 (calculation of the transition variables)
    for s = 1 to N_S do
        d(s) ← Distance(x_k, S_s)
    end for
    for θ_TC = 0 to N_TC - 1 do
        Γ_trans((:; θ_TC), 0) ← d(NextS(θ_TC, 0))
        Γ_trans((:; θ_TC), 1) ← d(NextS(θ_TC, 1))
    end for
    Γ_trans((:; :), 0) ← Γ_trans((:; :), 0) + Γ(k - 1, (:; :))
    Γ_trans((:; :), 1) ← Γ_trans((:; :), 1) + Γ(k - 1, (:; :))
    Γ_trans((:; :), BS) ← ∞
    P_trans((:; :), 0) ← 0
    P_trans((:; :), 1) ← P(k - 1, (:; :)) + 1
    P_trans((:; :), BS) ← 0
    S_trans((:; :), ← S(k - 1, (:; :))
    for θ_CRC = 0 to N_CRC - 1 do
        for θ_TC = 0 to N_TC - 1 do
            if P(k - 1, (θ_CRC; θ_TC)) = 5 then
                Γ_trans((θ_CRC; θ_TC), BS) ← Γ_trans((θ_CRC; θ_TC), 0)
                Γ_trans((θ_CRC; θ_TC), 0) ← ∞
                Γ_trans((θ_CRC; θ_TC), 1) ← ∞
                S_trans((θ_CRC; θ_TC)) ← S_trans((θ_CRC; θ_TC)) + 1
            end if
        end for
    end for
Part 3 (calculation of the state variables)
    for θ_CRC = 0 to N_CRC - 1 do
        for θ_TC = 0 to N_TC - 1 do
            σ_CRC(0) ← Prevθ_CRC(θ_CRC, 0)
            σ_CRC(1) ← Prevθ_CRC(θ_CRC, 1)
            σ_CRC(2) ← θ_CRC
            σ_TC(0) ← Prevθ_TC(θ_TC, 0)
            σ_TC(1) ← Prevθ_TC(θ_TC, 1)
            σ_TC(2) ← Prevθ_TC(θ_TC, 0)
            t ← arg min_t Γ_trans((σ_CRC(t); σ_TC(t)), t)
            Γ(k, (θ_CRC; θ_TC)) ← Γ_trans((σ_CRC(t); σ_TC(t)), t)
            P(k, (θ_CRC; θ_TC)) ← P_trans((σ_CRC(t); σ_TC(t)), t)
            S(k, (θ_CRC; θ_TC)) ← S_trans((σ_CRC(t); σ_TC(t)))
            R(k, (θ_CRC; θ_TC)) ← t
        end for
    end for
Part 4 (reading the path)
    θ_CRC ← 0
    θ_TC ← θ_TC^f
    n ← K - S(K, (0; θ_TC^f))
    for k = K to 1 do
        t ← R(k, (θ_CRC; θ_TC))
        if t ≠ BS then
            θ_CRC ← Prevθ_CRC(θ_CRC, t)
            θ_TC ← Prevθ_TC(θ_TC, t)
            U_n ← t
            n ← n - 1
        else
            θ_TC ← Prevθ_TC(θ_TC, 0)
        end if
    end for
```

The invention claimed is:

1. A method for decoding a sequence of symbols, said sequence having been generated by calculating a cyclic redundancy check value for an initial message, combining the initial message and the cyclic redundancy check value to produce a transformed message and encoding the transformed message;

the decoding comprising the generation of a plurality of path hypotheses across a trellis comprising nodes and branches, said branches representing the possible transitions between said nodes, as well as the selection of the most probable path hypothesis from said path hypotheses, with respect to the sequence of symbols, wherein said nodes represent the elements of a Cartesian product of at least the set of encoder states likely to have performed said encoding and the set of calculator states likely to have calculated the cyclic redundancy check value, and wherein a transition from a first node, corresponding to a first encoder state and a first calculator state, to a second node, corresponding to a second encoder state and a second calculator state, is possible, in the presence of a bit of transformed message, if
on applying this bit of transformed message to the encoder that is in the first encoder state, the encoder then passes to the second encoder state, and
on applying this bit of transformed message to the calculator that is in the first calculator state, the calculator passes to the second calculator state.

2. The method according to claim 1, wherein the selection of the path across the trellis is based on the Viterbi algorithm.

3. The method according to claim 1, wherein the selection of the path across the trellis is based on the SOVA algorithm.

4. The method according to claim 1, wherein the selection of the path across the trellis is based on the BCJR algorithm or on the simplified BCJR algorithm.

5. The method for decoding according to claim 1, the generation of the sequence of symbols having moreover comprised the insertion of stuffing bits in the transformed message before encoding the latter, method wherein the branches of the trellis comprise branches representing conditional transitions that can be used solely in the presence of a stuffing bit, and in which a transition from said first node to said second node being moreover possible in the presence of a stuffing bit, if
on applying this stuffing bit to the encoder that is in the first encoder state, the encoder then passes to the second encoder state, and
the first calculator state is equal to the second calculator state.

6. The method according to claim 5, wherein as a path hypothesis is being constructed, a stuffing bit is considered detected if the conditions according to which the insertion of a stuffing bit is performed are met.

7. The method according to claim 6, wherein a state variable is associated with each path hypothesis, said state variable being updated as the path hypothesis is being constructed depending on the already constructed path of the path hypothesis, and in which the state variable is monitored to determine if the conditions in which the insertion of a stuffing bit is performed are met.

8. The method according to any one of claim 1, wherein the initial message contains one or several redundancy bits, the method comprising the verification of the path hypothesis that was retained based on this or these redundancy bits.

9. The method according to claim 1, wherein the sequence of symbols is obtained from an AIS signal.

10. The method according to claim 9, wherein said sequence of symbols is obtained from a plurality of simultaneous or time-overlapping AIS signals.

11. A computer programme product comprising a non-volatile memory having stored therein a computer programme containing instructions causing the implementation of the method according to claim 1 when the computer programme is executed by a computer.

12. The method according to claim 9, wherein said AIS signal is received by a satellite.

13. The method according to claim 12, wherein said satellite is a low earth orbit satellite.

14. A decoder configured to implement a method for decoding a sequence of symbols, said sequence having been generated by calculating a cyclic redundancy check value for an initial message, combining the initial message and the cyclic redundancy check value to produce a transformed message and encoding the transformed message, the method comprising :

decoding a sequence of symbols the decoding comprising the generation of a plurality of path hypotheses across a trellis comprising nodes and branches, said branches representing the possible transitions between said nodes, as well as the selection of the most probable path hypothesis from said path hypotheses, with respect to the sequence of symbols, wherein said nodes represent the elements of a Cartesian product of at least the set of encoder states likely to have performed said encoding and the set of calculator states likely to have calculated the cyclic redundancy check value, and wherein a transition from a first node, corresponding to a first encoder state and a first calculator state, to a second node, corresponding to a second encoder state and a second calculator state, is possible, in the presence of a bit of transformed message, if
on applying this bit of transformed message to the encoder that is in the first encoder state, the encoder then passes to the second encoder state, and
on applying this bit of transformed message to the calculator that is in the first calculator state, the calculator passes to the second calculator state.

* * * * *